(12) United States Patent
Sasaki et al.

(10) Patent No.: US 11,908,666 B2
(45) Date of Patent: Feb. 20, 2024

(54) STAGE AND PLASMA PROCESSING APPARATUS

(71) Applicant: TOKYO ELECTRON LIMITED, Tokyo (JP)

(72) Inventors: Yasuharu Sasaki, Miyagi (JP); Tsuguto Sugawara, Miyagi (JP); Shin Yamaguchi, Miyagi (JP); Hajime Tamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 17/883,264

(22) Filed: Aug. 8, 2022

(65) Prior Publication Data

US 2022/0384155 A1 Dec. 1, 2022

Related U.S. Application Data

(63) Continuation of application No. 16/905,470, filed on Jun. 18, 2020, now Pat. No. 11,437,223.

(30) Foreign Application Priority Data

Jun. 18, 2019 (JP) .................................. 2019-113066

(51) Int. Cl.
*H01J 37/32* (2006.01)
*H01L 21/683* (2006.01)
*H01L 21/687* (2006.01)

(52) U.S. Cl.
CPC .... *H01J 37/32715* (2013.01); *H01J 37/3255* (2013.01); *H01J 37/32091* (2013.01);
(Continued)

(58) Field of Classification Search
CPC .......... H01J 37/32715; H01J 37/32091; H01J 37/32211; H01J 37/32541; H01J 37/3255;
(Continued)

(56) References Cited

U.S. PATENT DOCUMENTS

| 2011/0096461 A1* | 4/2011 | Yoshikawa ......... H01L 21/6833 361/234 |
|---|---|---|
| 2016/0189994 A1* | 6/2016 | Sasaki .................... H02N 13/00 361/234 |
| 2017/0018411 A1 | 1/2017 | Sriraman et al. |

FOREIGN PATENT DOCUMENTS

| JP | 2011-529273 A | 12/2011 |
|---|---|---|
| JP | 2016-122740 A | 7/2016 |

(Continued)

*Primary Examiner* — Renan Luque
(74) *Attorney, Agent, or Firm* — XSENSUS LLP

(57) ABSTRACT

A plasma processing apparatus includes a plasma processing chamber; a base disposed in the plasma processing chamber; an electrostatic chuck, disposed on the base, having a substrate support portion and an edge ring support portion on which an edge ring is disposed so as to surround a substrate; a first clamping electrode disposed in the substrate support portion; a first bias electrode disposed below the first clamping electrode in the substrate support portion; a second clamping electrode disposed in the edge ring support portion; a second bias electrode disposed below the second clamping electrode in the edge ring support portion; a first power source electrically connected to the first bias electrode; and a second power source electrically connected to the second bias electrode.

20 Claims, 3 Drawing Sheets

(52) U.S. Cl.
CPC ... *H01J 37/32211* (2013.01); *H01J 37/32541* (2013.01); *H01J 37/32568* (2013.01); *H01J 37/32642* (2013.01); *H01L 21/6831* (2013.01); *H01L 21/6833* (2013.01); *H01L 21/68721* (2013.01)

(58) Field of Classification Search
CPC .......... H01J 37/32568; H01J 37/32642; H01J 37/32697; H01J 37/32724; H01L 21/6831; H01L 21/6833; H01L 21/68721; H01L 21/6835; H01L 21/68757; B23Q 3/15; H02N 13/00
See application file for complete search history.

(56) References Cited

FOREIGN PATENT DOCUMENTS

| | | |
|---|---|---|
| JP | 2019-036658 A | 3/2019 |
| WO | 2016/052291 A1 | 4/2016 |

\* cited by examiner

STAGE AND PLASMA PROCESSING APPARATUS

CROSS-REFERENCE TO RELATED APPLICATIONS

This application is a Continuation of U.S. patent application Ser. No. 16/905,470, filed on Jun. 18, 2020, which claims priority from Japanese Patent Application No. 2019-113066, filed on Jun. 18, 2019 with the Japan Patent Office, all of which are incorporated herein in their entirety by reference and priority is claimed to each.

TECHNICAL FIELD

The present disclosure relates to a stage and a plasma processing apparatus.

BACKGROUND

In the manufacture of electronic devices, plasma processing apparatuses are being used. The plasma processing apparatus excites a gas supplied into a chamber by a radio-frequency power applied to a stage of the plasma processing apparatus to thereby generate plasma, and performs a plasma processing on a substrate disposed on the stage.

In recent years, a plasma processing has been performed using a high power condition particularly with respect to a radio-frequency for ion attraction (for bias). In contrast, for example, Japanese Patent Laid-Open Publication No. 2019-036658 proposes a technique that reduces the energy of ions applied to the inner wall of a chamber body.

SUMMARY

According to one aspect of the present disclosure, a stage includes: an electrostatic chuck configured to support a substrate; and an edge ring and a base configured to support the electrostatic chuck. The electrostatic chuck includes a first region having a first upper surface and configured to support the substrate placed on the first upper surface; a second region having a second upper surface, provided integrally around the first region, and configured to support the edge ring placed on the second upper surface; a first electrode provided in the first region and configured to apply a DC voltage; a second electrode provided in the second region and configured to apply a DC voltage; and a third electrode configured to apply a bias power.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
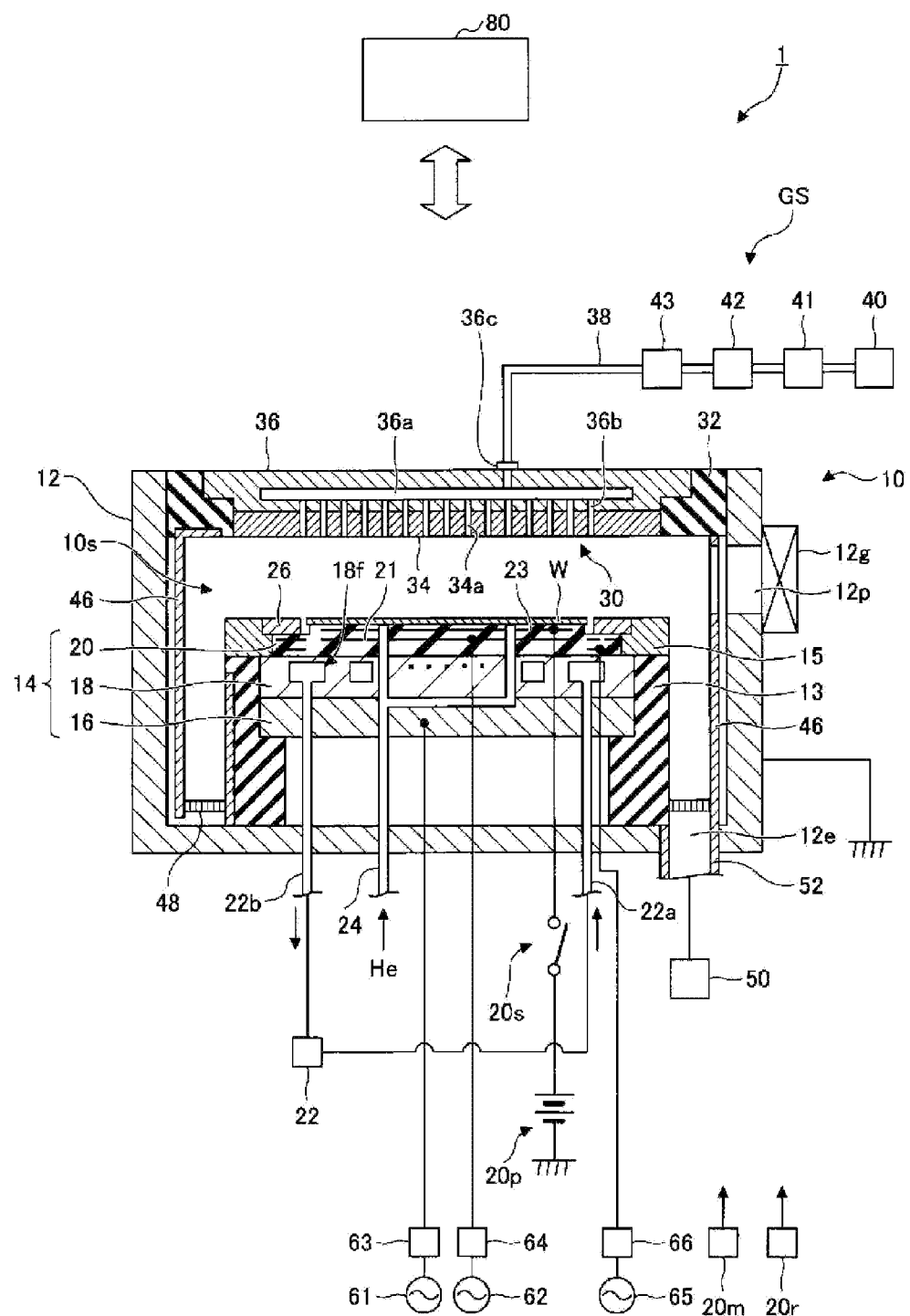
FIG. 1 is a schematic cross-sectional view illustrating an example of a plasma processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing the present disclosure will be described with reference to the accompanying drawings. The same components throughout the respective drawings are designated by the same reference numerals, and a redundant description may be omitted.

[Plasma Processing Apparatus]

FIG. 1 is a view schematically illustrating a plasma processing apparatus according to an embodiment. The plasma processing apparatus 1 illustrated in FIG. 1 is a capacitively coupled apparatus. The plasma processing apparatus 1 has a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of, for example, aluminum. A film having corrosion resistance is provided on the inner wall surface of the chamber body 12. The film having corrosion resistance may be a film formed of ceramics such as aluminum oxide and yttrium oxide.

A passage 12p is formed in the sidewall of the chamber body 12. A substrate W passes through the passage 12p when transferred between the internal space 10s and the outside of the chamber 10. The passage 12p may be opened and closed by a gate valve 12g. The gate valve 12g is provided along the sidewall of the chamber body 12.

A support 13 is provided on the bottom of the chamber body 12. The support 13 is formed of an insulating material. The support 13 has a substantially cylindrical shape. The support 13 extends upward from the bottom of the chamber body 12 in the internal space 10s. A member 15 is provided on the support 13. The member 15 may be formed of an insulator such as quartz. The member 15 may have a substantially cylindrical shape. Alternatively, the member 15 may be a plate-shaped body having a ring shape.

The plasma processing apparatus 1 further includes a substrate stage, i.e., a stage 14 according to an embodiment. The stage 14 is supported by the support 13. The stage 14 is provided in the internal space 10s. The stage 14 is configured to support the substrate W in the chamber 10, i.e., in the internal space 10s.

The stage 14 has a lower electrode 18 and an electrostatic chuck 20 according to an embodiment. The stage 14 may further have an electrode plate 16. The electrode plate 16 is formed of a conductor such as, for example, aluminum, and has a substantially disc shape. The lower electrode 18 is provided on the electrode plate 16. The lower electrode 18 is formed of a conductor such as, for example, aluminum, and has a substantially disc shape. The lower electrode 18 is electrically connected to the electrode plate 16. The outer peripheral surface of the lower electrode 18 and the outer peripheral surface of the electrode plate 16 are surrounded by the support 13. The electrode plate 16 and the lower electrode 18 are an example of a base that supports the electrostatic chuck 20.

The electrostatic chuck 20 is provided on the lower electrode 18. The edge of the electrostatic chuck 20 and an edge ring 26 are surrounded by the member 15. The electrostatic chuck 20 supports the substrate W and the edge ring 26 according to an embodiment.

The substrate W has, for example, a disc shape and is placed on the electrostatic chuck 20. The edge ring 26 is mounted on the electrostatic chuck 20 so as to surround the edge of the substrate W. An outer edge portion of the edge ring 26 may extend above the member 15. The edge ring 26 is a member having a ring shape. The edge ring 26 may be formed of, but not limited to, silicon, silicon carbide, or quartz. The edge ring 26 is also called a focus ring.

A flow path 18f is formed inside the lower electrode 18. A heat exchange medium (e.g., coolant) is supplied to the flow path 18f from a chiller unit 22 provided outside the chamber 10 through a pipe 22a. The heat exchange medium supplied to the flow path 18f is returned to the chiller unit 22 through the pipe 22b. In the plasma processing apparatus 1, the temperature of the substrate W placed on the electrostatic chuck 20 is regulated by heat exchange between the heat exchange medium and the lower electrode 18.

The plasma processing apparatus 1 is provided with a gas supply line 24. The gas supply line 24 supplies a heat transfer gas (e.g., He gas) between the upper surface of the electrostatic chuck 20 and the lower surface of the substrate W from a heat transfer gas supply mechanism.

The plasma processing apparatus 1 further includes an upper electrode 30. The upper electrode 30 is provided above the stage 14. The upper electrode 30 is supported on an upper portion of the chamber body 12 via a member 32. The member 32 is formed of a material having electric insulation. The upper electrode 30 and the member 32 close an upper opening in the chamber body 12.

The upper electrode 30 may include a top plate 34 and a support 36. The lower surface of the top plate 34 is the lower surface at the internal space 10s side, and defines the internal space 10s. The top plate 34 may be formed of a low-resistance conductor or semiconductor having low Joule heat. A plurality of gas discharge holes 34a are formed in the top plate 34. The gas discharge holes 34a penetrate the top plate 34 in the plate thickness direction.

The support 36 detachably supports the top plate 34. The support 36 is formed of a conductive material such as aluminum. A gas diffusion chamber 36a is provided inside the support 36. A plurality of gas holes 36b are formed in the support 36. The gas holes 36b extend downward from the gas diffusion chamber 36a. The gas holes 36b communicate with the respective gas discharge holes 34a. A gas inlet 36c is formed in the support 36. The gas inlet 36c is connected to the gas diffusion chamber 36a. A gas supply pipe 38 is connected to the gas inlet 36c.

A gas supply GS is connected to the gas supply pipe 38. The gas supply GS includes a gas source group 40, a valve group 41, a flow rate controller group 42, and a valve group 43. The gas source group 40 is connected to the gas supply pipe 38 via the valve group 41, the flow rate controller group 42, and the valve group 43. The gas source group 40 includes a plurality of gas sources. Each of the valve group 41 and the valve group 43 includes a plurality of opening and closing valves. The flow rate controller group 42 includes a plurality of flow rate controllers. Each of the flow rate controllers of the flow rate controller group 42 is a mass flow controller or a pressure control type flow rate controller. Each of the gas sources of the gas source group 40 is connected to the gas supply pipe 38 via a corresponding opening and closing valve of the valve group 41, a corresponding flow rate controller of the flow rate controller group 42, and a corresponding opening and closing valve of the valve group 43.

In the plasma processing apparatus 1, a shield 46 is detachably provided along the inner wall surface of the chamber body 12. The shield 46 is also provided on the outer periphery of the support 13. The shield 46 prevents reaction products such as, for example, etching by-products from adhering to the chamber body 12. The shield 46 is configured by forming a film having corrosion resistance on the surface of a member formed of, for example, aluminum. The film having corrosion resistance may be a film formed of ceramics such as yttrium oxide.

A baffle plate 48 is provided between the support 13 and the sidewall of the chamber body 12. The baffle plate 48 is configured by forming a film having corrosion resistance on the surface of a member formed of, for example, aluminum. The film having corrosion resistance may be a film formed of ceramics such as yttrium oxide. A plurality of through-holes are formed in the baffle plate 48. An exhaust port 12e is provided below the baffle plate 48 and in the bottom of the chamber body 12. An exhaust device 50 is connected to the exhaust port 12e via an exhaust pipe 52. The exhaust device 50 has a vacuum pump such as a pressure regulating valve and a turbo molecular pump.

The plasma processing apparatus 1 includes a first radio-frequency power supply 61 which applies a radio-frequency HF of power for plasma generation. The first radio-frequency power supply 61 is configured to generate a radio-frequency HF of power in order to generate plasma from a gas in the chamber 10. The frequency of the radio-frequency HF is, for example, a frequency in a range of 27 MHz to 100 MHz.

The first radio-frequency power supply 61 is electrically connected to the lower electrode 18 via a matcher 63. The matcher 63 has a matching circuit. The matching circuit of the matcher 63 is configured to match the impedance on the load side (lower electrode side) of the first radio-frequency power supply 61 with the output impedance of the first radio-frequency power supply 61. In another embodiment, the first radio-frequency power supply 61 may be electrically connected to the upper electrode 30 via the matcher 63.

The plasma processing apparatus 1 may further include a second radio-frequency power supply 62 which applies a radio-frequency LF of power for ion drawing-in. The second radio-frequency power supply 62 is configured to generate a radio-frequency LF of power. The radio-frequency LF has a frequency mainly suitable for drawing ions into the substrate W, and is, for example, a frequency in a range of 400 kHz to 13.56 MHz. Alternatively, the radio-frequency LF may be a pulsed voltage having a rectangular waveform.

The second radio-frequency power supply 62 is electrically connected to a bias electrode 21 in the electrostatic chuck 20 via a matcher 64. The matcher 64 has a matching circuit. The matching circuit of the matcher 64 is configured to match the impedance on the load side (bias electrode side) of the second radio-frequency power supply 62 with the output impedance of the second radio-frequency power supply 62.

The plasma processing apparatus 1 may further include a controller 80. The controller 80 may be a computer including a processor, a storage such as, for example, a memory, an input device, a display device, and a signal input and output interface. The controller 80 controls each part of the plasma processing apparatus 1. In the controller 80, an operator may perform, for example, an input operation of a command for managing the plasma processing apparatus 1 using the input device. Further, in the control unit 80, the operational state of the plasma processing apparatus 1 may be visualized and displayed by the display device. Furthermore, the storage of the controller 80 stores a control program and recipe data. The control program is executed by the processor of the controller 80 in order to execute various processings in the plasma processing apparatus 1. The processor of the controller 80 executes the control program and controls each part of the plasma processing apparatus 1 according to the recipe data, so that various processes (e.g., a plasma processing method) are executed in the plasma processing apparatus 1.

[Stage]

Figure 2:
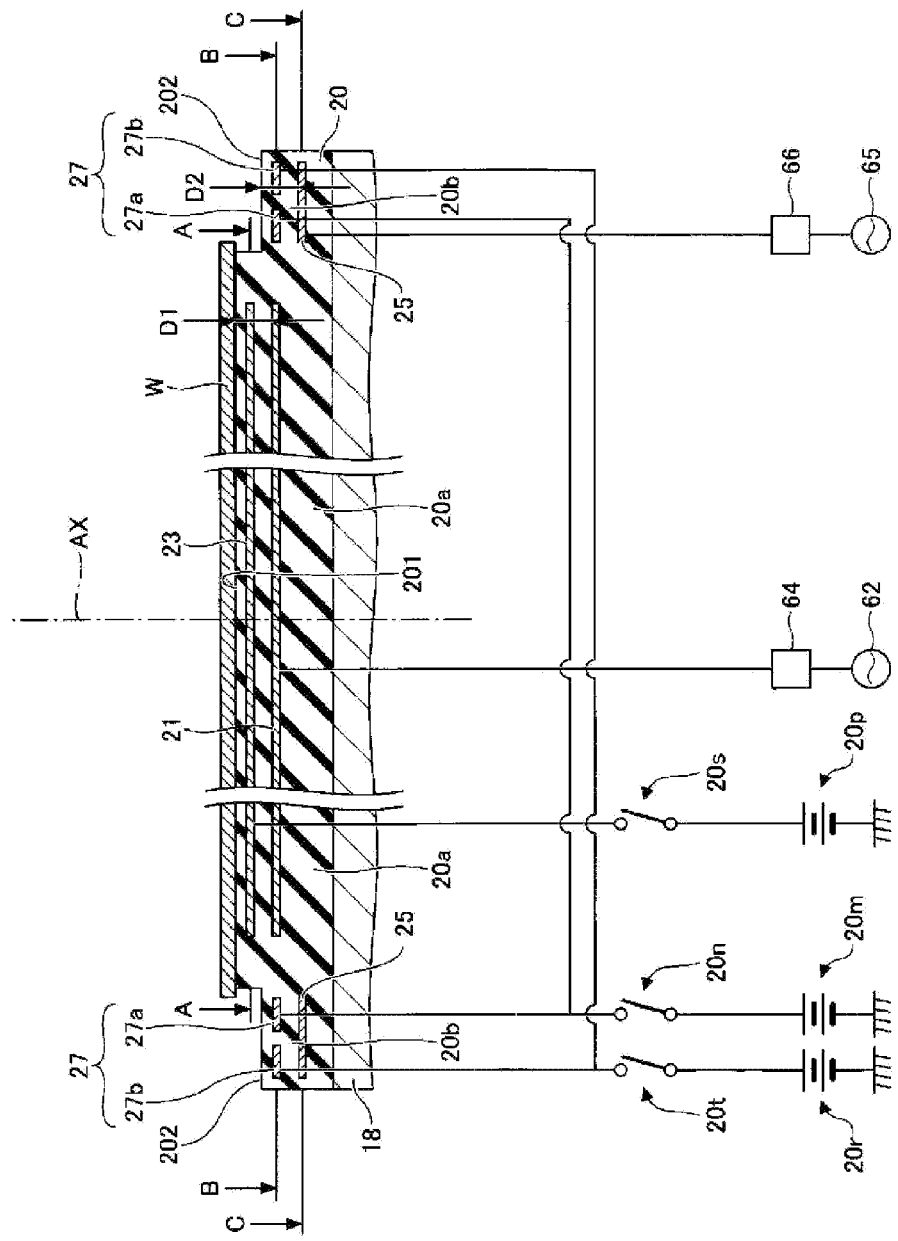
FIG. 2 is a view illustrating an example of a stage according to an embodiment.

Hereinafter, the stage 14 according to an embodiment will be described in detail. In the following description, reference is made to FIG. 2 together with FIG. 1. FIG. 2 is a cross-sectional view illustrating the stage 14 according to an embodiment.

The electrostatic chuck 20 has a body. The body of the electrostatic chuck 20 has a substantially disc shape. The body of the electrostatic chuck 20 is formed of a dielectric material. The body of the electrostatic chuck 20 includes a first region 20a and a second region 20b.

The first region 20a is a region having a substantially disc shape. The first region 20a has a first upper surface 201. The first region 20a is configured to hold the substrate W placed on the first upper surface 201. The diameter of the first region 20a is less than the diameter of the substrate W.

The second region 20b is a region having a ring shape. The second region 20b shares a central axis (the axis AX in FIG. 2) with the first region 20a. The second region 20b has a second upper surface 202. The second region 20b is provided integrally around the first region 20a and is configured to support the edge ring 26 mounted on the second upper surface 202 (see FIG. 1).

The body of the electrostatic chuck 20, i.e., the first region 20a and the second region 20b, may be formed of a single dielectric material. That is, the dielectric material constituting the first region 20a and the dielectric material constituting the second region 20b may be the same. For example, the main body of the electrostatic chuck 20 may be formed of ceramics such as aluminum oxide and aluminum nitride. In the electrostatic chuck 20, the second upper surface 202 of the second region 20b is lower than the first upper surface 201 of the first region 20a, and the thickness of the first region 20a is greater than the thickness of the second region 20b.

The electrostatic chuck 20 further has an attracting electrode 23. The attracting electrode 23 is provided in the first region 20a. The attracting electrode 23 is connected to a DC power supply 20p via a switch 20s. When a DC voltage is applied from the DC power supply 20p to the attracting electrode 23, an electrostatic attraction is generated between the first region 20a and the substrate W. By the generated electrostatic attraction, the substrate W is attracted to the first region 20a and is held by the first region 20a. The attracting electrode 23 is an example of a first electrode that is provided in the first region 20a and applies a DC voltage.

The electrostatic chuck 20 further has an attracting electrode 27a and an attracting electrode 27b (hereinafter, also collectively referred to as an attracting electrode 27). The attracting electrode 27a and the attracting electrode 27b are provided in the second region 20b. The attracting electrode 27a and the attracting electrode 27b extend in the circumferential direction with respect to the center axis of the electrostatic chuck 20. The attracting electrode 27b is provided outside the attracting electrode 27a. A DC power supply 20m is electrically connected to the attracting electrode 27a via a switch 20n, and a DC power supply 20r is electrically connected to the attracting electrode 27b via a switch 20t. A DC voltage is applied to each of the attracting electrode 27a and the attracting electrode 27b from the DC power supply 20m or the DC power supply 20r so that a potential difference occurs between the attracting electrode 27a and the attracting electrode 27b. For example, the polarity of the DC voltage applied to the attracting electrode 27a from the DC power supply 20m may be opposite to the polarity of the DC voltage applied to the attracting electrode 27b from the DC power supply 20r. However, the attracting electrode 27 is not limited to a bipolar electrode, and may be a monopolar electrode. When the DC voltage is applied to each of the attracting electrode 27a and the attracting electrode 27b from the DC power supply 20m or the DC power supply 20r, an electrostatic attraction occurs between the second region 20b and the edge ring 26. By the generated electrostatic attraction, the edge ring 26 is attracted to the second region 20b and is held by the second region 20b. The attracting electrode 27a and the attracting electrode 27b are an example of a second electrode that is provided in the second region 20b and applies a DC voltage.

The bias electrode 21 is provided below the attracting electrode 23 in the first region 20a. A bias electrode 25 is provided below the attracting electrode 27a and the attracting electrode 27b in the second region 20b. A third radio-frequency power supply 65 is electrically connected to the bias electrode 25 in the second region 20b via a matcher 66. The matcher 66 has a matching circuit. The matching circuit of the matcher 66 is configured to match the impedance on the load side (bias electrode side) of the third radio-frequency power supply 65 with the output impedance of the third radio-frequency power supply 65.

The bias electrode 21 and the bias electrode 25 apply a bias power for ion drawing-in. The bias power is applied by a DC voltage or a radio-frequency voltage. In the examples of FIGS. 1 and 2, the bias power is applied from the third radio-frequency power supply 65 to the bias electrode 25 by the radio-frequency voltage, but the present disclosure is not limited thereto, and the bias power may also be applied by a DC voltage from a DC power supply. When the bias power is applied to the bias electrode 21, ions in plasma are drawn towards the first region 20a. Thus, it is possible to control process characteristics such as, for example, an etching rate or a film forming rate over the entire surface of the substrate W. When the bias power is applied to the bias electrode 25, ions in plasma are drawn towards the second region 20b. Thus, it is possible to control process characteristics of an edge region of the substrate W.

The bias electrode 21 and the bias electrode 25 are an example of a third electrode which applies a bias power. The bias electrode 21 is an example of a 3-$1^{st}$ electrode provided in the first region 20a, and the bias electrode 25 is an example of a 3-$2^{nd}$ electrode provided in the second region 20b. The bias power applied to the bias electrode 21 and the bias power applied to the bias electrode 25 are controlled independently of each other by the second radio-frequency power supply 62 and the third radio-frequency power supply 65. The third electrode may have at least the bias electrode 21 and may not have the bias electrode 25.

The attracting electrode 23 in the first region 20a is provided between the first upper surface 201 and the bias electrode 21. The attracting electrode 23 and the bias electrode 21 have a circular shape having substantially the same diameter. The attracting electrode 27a and the attracting electrode 27b in the second region 20b are provided between the second upper surface 202 and the bias electrode 25. The attracting electrode 27a, the attracting electrode 27b, and the bias electrode 25 have an annular shape. The radial widths of the attracting electrode 27b and the attracting electrode 27a are substantially the same, and the radial width of the bias electrode 25 is greater than the sum of the radial widths of the attracting electrode 27a and the attracting electrode 27b.

The bias electrode 21, the attracting electrode 27a, and the attracting electrode 27b are disposed in the same plane of the electrostatic chuck 20. The thickness D1 from the first upper surface 201 to the upper surface of the bias electrode 21 is equal to the thickness D2 from the second upper surface 202 to the upper surface of the bias electrode 25.

[Reason for Provision of Bias Electrode in Electrostatic Chuck]

Descriptions will be made on the reason why the bias electrode 21 and the bias electrode 25 are provided in the electrostatic chuck 20. In recent years, a plasma processing has been performed using a high power condition particularly with respect to a radio-frequency LF for ion drawing-in. When a radio-frequency LF of high power is applied to the electrode plate 16, a potential difference occurs between the electrode plate 16 and the substrate W and between the electrode plate 16 and the edge ring 26 according to the capacitance between the electrode plate 16 and the substrate W and the capacitance between the electrode plate 16 and the edge ring 26. Therefore, ionization occurs in the heat transfer gas supplied to the back surface of the substrate W and the back surface of the edge ring 26. As a result, abnormal discharge may occur at the back surface of the substrate W and/or the back surface of the edge ring 26.

Therefore, in the stage 14 according to the present embodiment, in order to suppress the discharge of the heat transfer gas, the bias electrode 21 is provided in the first region 20a and the bias electrode 25 is provided in the second region 20b of the electrostatic chuck 20. Thus, it is possible to increase the capacitance between the bias electrode 21 and the substrate W and the capacitance between the bias electrode 25 and the edge ring 26.

The impedance Z of radio-frequency current flowing when the radio-frequency LF power is applied to the bias electrode 21 and the bias electrode 25 of the electrostatic chuck 20 is represented by the following equation:

$$Z=-(1/C\omega) \times j$$

By increasing the capacitance C, the impedance Z of the radio-frequency current flowing through the electrostatic chuck 20 may be reduced. Therefore, a potential difference between the substrate W and the bias electrode 21 is reduced.

Further, in an RC circuit, the time constant T is represented by the following equation:

$$\tau = RC$$

Thus, when the RC is small, the potential is likely to change. Therefore, by increasing the capacitance C, the RC may be increased, and a change in the potential of the substrate W and the edge ring 26 may be suppressed.

For example, when the state of the bias electrode 21 instantaneously becomes −5000V, the substrate W also instantaneously becomes −5000V. At this time, since ions in plasma are drawn into the substrate W, the potential of the substrate W changes in the positive direction. Increasing the capacitance between the substrate W and the bias electrode 21 and the capacitance between the edge ring 26 and the bias electrode 25 may make it difficult for the potential of the substrate W to change in the positive direction.

As described above, in the stage 14 according to the present embodiment, the bias electrode 21 and the bias electrode 25 are provided in the electrostatic chuck 20, and the radio-frequency LF of power is applied to the bias electrode 21 and the bias electrode 25. According to this, the capacitance between the bias electrode 21 and the substrate W and the capacitance between the bias electrode 25 and the edge ring 26 may be increased as compared to a case where the radio-frequency LF power is applied to the electrode plate 16. Thus, it is possible to reduce the potential difference between the substrate W and the edge ring 26, and suppress a change in the potential of the substrate W and the edge ring 26. Thus, it is possible to suppress the discharge of the heat transfer gas supplied to the back surface of the substrate W. As a result, the occurrence of abnormal discharge in the back surface of the substrate W and the back surface of the edge ring 26 may be suppressed.

Further, the thickness D1 from the first upper surface 201 to the bias electrode 21 and the thickness D2 from the second upper surface 202 to the bias electrode 25 may be the same. Therefore, the capacitance between the bias electrode 21 and the substrate W and the capacitance between the bias electrode 25 and the edge ring 26 may be substantially the same. Thus, it is possible to further reduce or eliminate the potential difference between the substrate W and the edge ring 26, so that the occurrence of abnormal discharge between the substrate W and the edge ring 26 may be more effectively suppressed.

An adhesive layer is provided between the lower electrode 18 and the electrostatic chuck 20 to attach the lower electrode 18 and the electrostatic chuck 20 to each other. When a radio-frequency LF is applied to the electrode plate 16 as before, the adhesive layer having a low dielectric constant prevents an increase in the capacitance between the bias electrode 21 and the substrate W and the capacitance between the bias electrode 25 and the edge ring 26.

Meanwhile, in the stage 14 according to the present embodiment, the bias electrode 21 and the bias electrode 25 are embedded above the adhesive layer between the lower electrode 18 and the electrostatic chuck 20. Thus, no adhesive layer is interposed between the bias electrode 21 and the substrate W and between the bias electrode 25 and the edge ring 26. According to this, due to the absence of the adhesive layer, the capacitance between the bias electrode 21 and the substrate W and the capacitance between the bias electrode 25 and the edge ring 26 may be further increased, and free design for the heat transfer or stress relaxation of the adhesive layer becomes possible.

The radio-frequency HF power for plasma generation is applied to the electrode plate 16, but may be applied to the upper electrode 30.

[Each Electrode]

Figure 3A:
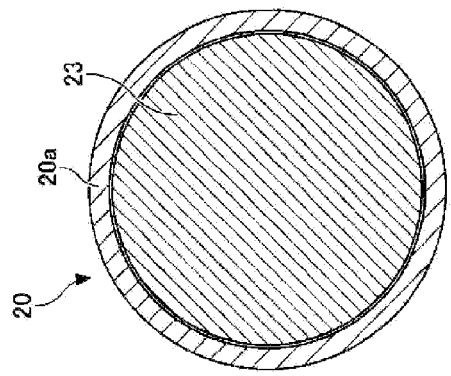
FIGS. 3A to 3C are views respectively illustrating an A-A cross section, a B-B cross section, and a C-C cross section of the stage according to an embodiment.
Figure 3B:
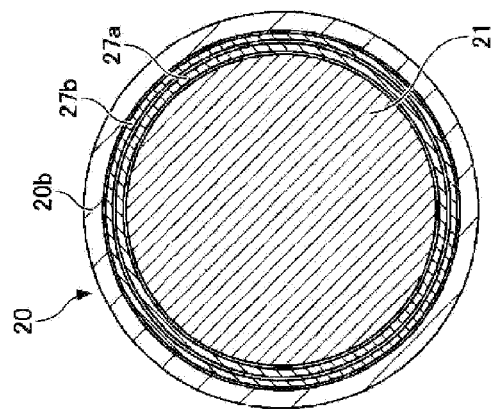
Figure 3C:
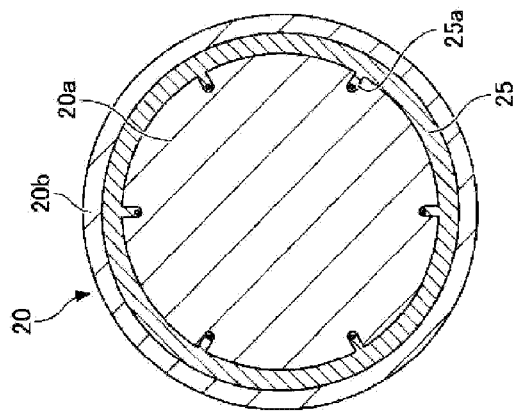

Next, each electrode embedded in the electrostatic chuck 20 will be described with reference to FIGS. 3A to 3C. FIG. 3A is a view illustrating an A-A cross section of the electrostatic chuck 20 illustrated in FIG. 2. FIG. 3B is a view illustrating a B-B cross section of the electrostatic chuck 20. FIG. 3C is a view illustrating a C-C cross section of the electrostatic chuck 20.

Referring to the A-A cross section of FIG. 3A, the circular attracting electrode 23 is provided in the circular first region 20a. The attracting electrode 23 is a film-shaped or sheet-shaped electrode.

Referring to the B-B cross section of FIG. 3B, the annular attracting electrodes 27a and 27b are provided in the second region 20b. Each of the attracting electrode 27a and the attracting electrode 27b is a film-shaped or sheet-shaped electrode. The attracting electrode 27b is provided outside the attracting electrode 27a.

Further, the circular bias electrode 21 is provided in the first region 20*a* inside the attracting electrode 27*a*. The bias electrode 21 has a sheet shape or a mesh shape. The bias electrode 21 is formed of conductive ceramics including a metal and ceramics used in the electrostatic chuck 20.

The bias electrode 21 has a resistance value equal to or less than a predetermined value (e.g., 0.1 Ω·cm). This is because it takes time to transfer charge in the radial direction and it is impossible to stably apply the radio-frequency LF power when the resistance value of a sheet-shaped or mesh-shaped member forming the bias electrode 21 is greater than the predetermined value.

For example, when the frequency of the radio-frequency LF is, for example, 400 kHz, the bias electrode 21 may be formed using a member having a sufficiently high charge movement speed with respect to the frequency and having a sufficiently low electric resistance.

The material used in the bias electrode 21 may be, but not limited thereto, conductive ceramics obtained by combining a high melting point metal based material such as, for example, tungsten, tantalum, and molybdenum with ceramics constituting the electrostatic chuck.

Furthermore, considering the linear expansion coefficient difference between members such as between the bias electrode 21 and ceramics of the electrostatic chuck 20 in which the bias electrode 21 is embedded, the bias electrode 21 may be a mesh-shaped metal rather than a sheet-shaped metal. Thus, it is possible to reduce the difference in contraction between the bias electrode 21 and the electrostatic chuck 20 caused by the linear expansion coefficient difference between the bias electrode 21 and the electrostatic chuck 20 due to heat input from plasma, thereby reducing friction between the bias electrode 21 and the electrostatic chuck 20.

Referring to the C-C cross section of FIG. 3C, the annular bias electrode 25 is provided in the second region 20*b*. The bias electrode 25 is a film-shaped or sheet-shaped electrode. The bias electrode 25 has power supply terminals 25*a* uniformly arranged in the circumferential direction. Therefore, the impedance of the radio-frequency LF may be made uniform in the circumferential direction. Thus, it is possible to reduce deviation in the circumferential direction of the radio-frequency LF.

The bias electrode 25 has a sheet shape or a mesh shape. The bias electrode 25 is formed of conductive ceramics including a metal and ceramics used in the electrostatic chuck 20.

The bias electrode 25 has a resistance value equal to or less than a predetermined value (e.g., 0.1 Ω·cm). The material used in the bias electrode 25 may be, but not limited thereto, conductive ceramics obtained by combining a high melting point metal based material such as, for example, tungsten, tantalum, and molybdenum with ceramics constituting the electrostatic chuck.

Further, the bias electrode 25 may be a mesh-shaped metal rather than a sheet-shaped metal. Therefore, it is possible to reduce the difference in contraction between the bias electrode 25 and the electrostatic chuck 20 caused by the linear expansion coefficient difference between the bias electrode 25 and the electrostatic chuck 20 due to heat input from plasma, thereby reducing friction between the bias electrode 25 and the electrostatic chuck 20.

As described above, according to the stage 14 and the plasma processing apparatus 1 of the present embodiment, by providing the bias electrodes 21 and 25 in the electrostatic chuck 20, the discharge of the heat transfer gas supplied between the lower surface of the substrate W and the upper surface of the electrostatic chuck 20 may be suppressed.

The plasma processing apparatus of the present disclosure may also be applied to any type of apparatus among an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

Further, the plasma processing apparatus may be any apparatus that performs a predetermined processing (e.g., an etching processing or a film forming processing) on the substrate.

According to one aspect, the discharge of a heat transfer gas supplied between the lower surface of a substrate and the upper surface of an electrostatic chuck may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a plasma processing chamber;
a base disposed in the plasma processing chamber;
an electrostatic chuck, disposed on the base, having a substrate support portion and an edge ring support portion on which an edge ring is disposed so as to surround a substrate;
a first clamping electrode disposed in the substrate support portion;
a first bias electrode disposed below the first clamping electrode in the substrate support portion;
a second clamping electrode disposed in the edge ring support portion;
a second bias electrode disposed below the second clamping electrode in the edge ring support portion;
a first power source electrically connected to the first bias electrode; and
a second power source electrically connected to the second bias electrode.

2. The plasma processing apparatus according to claim 1, wherein the second power source is an RF power source.

3. The plasma processing apparatus according to claim 1, wherein at least one of the first power source and the second power source is a DC power source.

4. The plasma processing apparatus according to claim 3, wherein at least one of the first power source and the second power source is a negative pulsed DC power source.

5. The plasma processing apparatus according to claim 1, wherein the first bias electrode and the second clamping electrode are disposed at a same height in the electrostatic chuck.

6. The plasma processing apparatus according to claim 1, wherein the second bias electrode has a plurality of power supply terminals circumferentially disposed at equal distances.

7. The plasma processing apparatus according to claim 1, wherein the second clamping electrode includes a plurality of electrodes.

8. An electrostatic chuck comprising:
a dielectric portion having a substrate support portion and an edge ring support portion on which an edge ring is disposed so as to surround a substrate;
a first clamping electrode disposed in the substrate support portion;
a first bias electrode disposed below the first clamping electrode in the substrate support portion;
a second clamping electrode disposed in the edge ring support portion; and
a second bias electrode disposed below the second clamping electrode in the edge ring support portion.

9. The electrostatic chuck according to claim 8, wherein an RF voltage is applied to the second bias electrode.

10. The electrostatic chuck according to claim 8, wherein a DC voltage is applied to at least one of the first bias electrode and the second bias electrode.

11. The electrostatic chuck according to claim 10, wherein a negative pulsed DC voltage is applied to at least one of the first bias electrode and the second bias electrode.

12. The electrostatic chuck according to claim 8, wherein the first bias electrode and the second clamping electrode are disposed at a same height in the dielectric portion.

13. The electrostatic chuck according to claim 8, wherein the second bias electrode has a plurality of power supply terminals circumferentially disposed at equal distances.

14. The plasma processing apparatus according to claim 8, wherein the second clamping electrode includes a plurality of electrodes.

15. A substrate support comprising:
a base;
an electrostatic chuck, disposed on the base, having a substrate support portion and an edge ring support portion on which an edge ring is disposed so as to surround a substrate;
a first clamping electrode disposed in the substrate support portion;
a first bias electrode disposed below the first clamping electrode in the substrate support portion;
a second clamping electrode disposed in the edge ring support portion; and
a second bias electrode disposed below the second clamping electrode in the edge ring support portion.

16. The substrate support according to claim 15, wherein an RF voltage is applied to the second bias electrode.

17. The substrate support according to claim 15, wherein a DC voltage is applied to at least one of the first bias electrode and the second bias electrode.

18. The substrate support according to claim 17, wherein a negative pulsed DC voltage is applied to at least one of the first bias electrode and the second bias electrode.

19. The substrate support according to claim 15, wherein the first bias electrode and the second clamping electrode are disposed at a same height in the electrostatic chuck.

20. The substrate support according to claim 15, wherein the second bias electrode has a plurality of power supply terminals circumferentially disposed at equal distances.

* * * * *